(12) United States Patent
Shimoe et al.

(10) Patent No.: US 6,815,834 B2
(45) Date of Patent: Nov. 9, 2004

(54) ELECTRONIC PART

(75) Inventors: Kazunobu Shimoe, Kanazawa (JP);
Mitsuo Takeda, Ishikawa-ken (JP);
Toshiaki Takata, Kanazawa (JP);
Norihiko Takada, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 36 days.

(21) Appl. No.: 10/240,513
(22) PCT Filed: Dec. 28, 2001
(86) PCT No.: PCT/JP01/11657
§ 371 (c)(1), (2), (4) Date: Apr. 22, 2003
(87) PCT Pub. No.: WO02/061834
PCT Pub. Date: Aug. 8, 2002

(65) Prior Publication Data
US 2003/0160334 A1 Aug. 28, 2003

(30) Foreign Application Priority Data
Jan. 30, 2001 (JP) ......................................... 2001-022148
Sep. 17, 2001 (JP) ......................................... 2001-281918

(51) Int. Cl.[7] ......................... H01L 23/48; H01L 23/52; H01L 29/40
(52) U.S. Cl. ..................... 257/779; 257/738; 257/780; 257/782; 257/785; 257/786
(58) Field of Search ................................. 257/779, 782, 257/786, 737, 738, 780, 785, 777, 676, 690, 778

(56) References Cited

U.S. PATENT DOCUMENTS

| 5,148,266 | A |   | 9/1992 | Khandros et al. |
| 5,261,593 | A |   | 11/1993 | Casson et al. |
| 6,194,782 | B1 | * | 2/2001 | Katchmar .................... 257/738 |
| 6,222,277 | B1 | * | 4/2001 | Downes ....................... 257/778 |
| 6,274,964 | B1 | * | 8/2001 | Yoshida et al. ............. 310/321 |
| 2003/0137039 | A1 | * | 7/2003 | Nakano et al. .............. 257/680 |

FOREIGN PATENT DOCUMENTS

DE 19525388 A1 1/1996

* cited by examiner

Primary Examiner—Minhloan Tran
Assistant Examiner—Victor A. Mandala, Jr.
(74) Attorney, Agent, or Firm—Keating & Bennett LLP

(57) ABSTRACT

An electronic component includes an electronic element and a substrate to which the electronic element is mounted, the electronic element and the substrate being electrically or mechanically connected to each other by at least three bumps. Both the value obtained by dividing the total bonding-area of the bumps bonded to the electronic element by the mass of the electronic element and the value obtained by dividing the total bonding-area of the bumps bonded to the substrate by the mass of the electronic element are at least about 8.8 $mm^2/g$.

14 Claims, 3 Drawing Sheets

10

10

| TOTAL BONDING-AREA OF BUMPS / MASS OF ELECTRONIC ELEMENT (mm²/g) | FAULT RATIO (%) |
|---|---|
| 6.000 | 31 |
| 8.000 | 15 |
| 8.800 | 7 |
| 10.800 | 2 |
| 11.600 | 0 |

ELECTRONIC PART

BACKGROUND OF THE INVENTION

1. Field of the Invention

The present invention relates to an electronic component including an electronic element and a substrate on which the electronic element is mounted.

2. Description of the Related Art

In recent years, the sizes and heights of electronic components including electronic elements and substrates on which the electronic elements are mounted have been increasingly reduced. In such situations, a process in which a predetermined surface of an electronic element and that of a substrate are mechanically or electrically connected to each other by electrically conductive bumps, the so-called flip-chip process, is often used.

FIGS. 1A and B are respective different longitudinal cross sectional views of an electronic component 10 using a generally-used flip-chip process of the related art. As shown in FIGS. 1A and B, the electronic component 10 includes an electronic element 20 and a substrate 30 onto which the electronic element 20 is mounted.

As shown in FIG. 1A, a predetermined functional surface 120 of the electronic element 20 is positioned so as to face in a particular direction (downwards in FIG. 1A), and is opposed to a predetermined mount surface 130 of the substrate 30. The electronic element 20 and the substrate 30 are connected to each other electrically and mechanically by metallic bumps 40 interposed between them. Moreover, as shown in FIG. 1B, to strengthen the connection, a method of filling a resin 90 between the electronic element 20 and the substrate 30 is generally known, for example, in the semiconductor device field and so forth. The resin 90 used for the above-described purpose is generally called an under-fill.

However, in the case of electronic components in which electrodes or the like are provided on the functional surfaces of electronic elements such as surface acoustic wave elements, and the functions of the elements cannot sufficiently be achieved if a resin adheres to the functional surfaces, the under-fill cannot be applied. Accordingly, the electronic elements are mechanically connected to the mount surfaces of the substrates by the bumps only. If the total contact-area of the bumps based on the mass of an electronic element is small, problems will arise in that the electronic element is released or separated from the bumps, due to external mechanical loads caused by falling, vibration, and other conditions, and the functions of the electronic component itself are deteriorated.

SUMMARY OF THE INVENTION

In order to overcome the problems described above, preferred embodiments of the present invention provide an electronic component in which an electronic element and a substrate can be mechanically bonded to each other with sufficient strength.

According to a preferred embodiment of the present invention, an electronic component of the present invention includes an electronic element and a substrate to which the electronic element is mounted, the electronic element and the substrate being electrically or mechanically connected to each other by at least three bumps, wherein both the value obtained by dividing the total bonding-area of the at least three bumps bonded to the electronic element by the mass of the electronic element and the value obtained by dividing the total bonding-area of the at least three bumps bonded to the substrate by the mass of the electronic element are at least about 8.8 mm$^2$/g.

It is preferable and advantageous if both the value obtained by dividing the total bonding-area of the bumps bonded to the electronic element by the mass of the electronic element and the value obtained by dividing the total bonding-area of the bumps bonded to the substrate by the mass of the electronic element are at least about 11.6 mm$^2$/g.

Moreover, the electronic component of preferred embodiments of the present invention is preferably characterized in that the bumps are made of Au or an alloy including Au as a major component.

Furthermore, it is preferred that the electronic component of the present invention is constructed such that the electronic element and the substrate are mechanically connected to each other by the bumps only.

Also, in the electronic component of preferred embodiments of the present invention, the electronic element may be a surface acoustic wave element including at least one IDT electrode disposed on a piezoelectric substrate.

According to the electronic component of preferred embodiments of the present invention, mechanical bonding at a sufficient strength can be achieved even for a surface acoustic wave device as the electronic component including a surface acoustic wave element in which an under-fill cannot be used for bonding of the electronic element to a substrate.

Other features, elements, characteristics and advantages of the present invention will become more apparent from the following detailed description of preferred embodiments with reference to the attached drawings.

DETAILED DESCRIPTION OF PREFERRED EMBODIMENTS

Hereinafter, a preferred embodiment of the present invention will be described with reference to FIGS. 2 to 4.

Figure 1A:
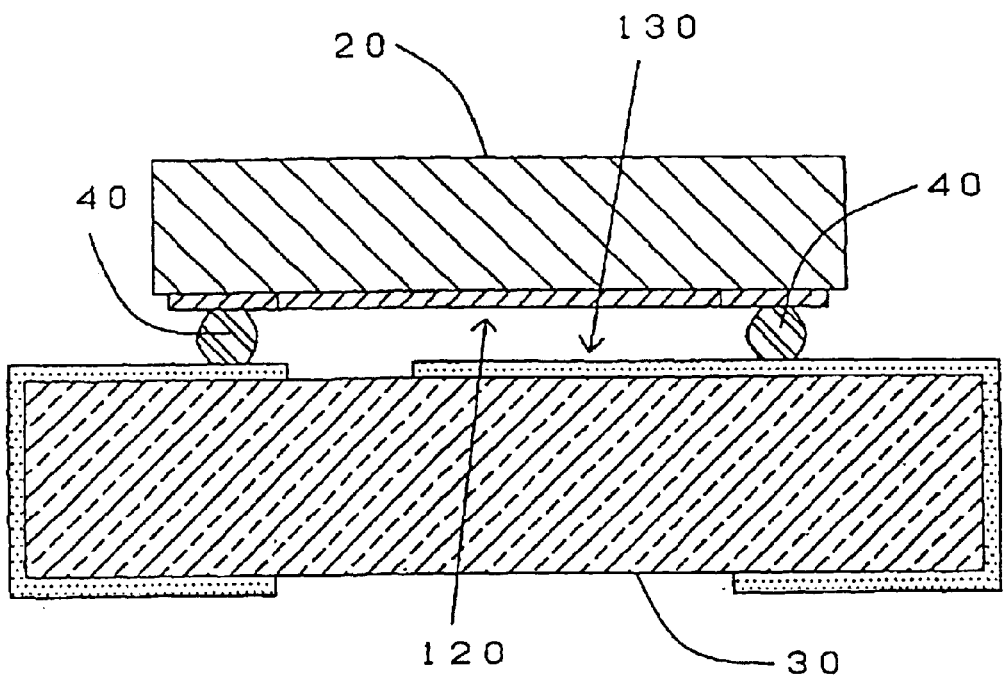
FIGS. 1A and 1B are respective different longitudinal cross-sectional views of an electronic component using a generally-used flip-chip process of the related art.
Figure 1B:
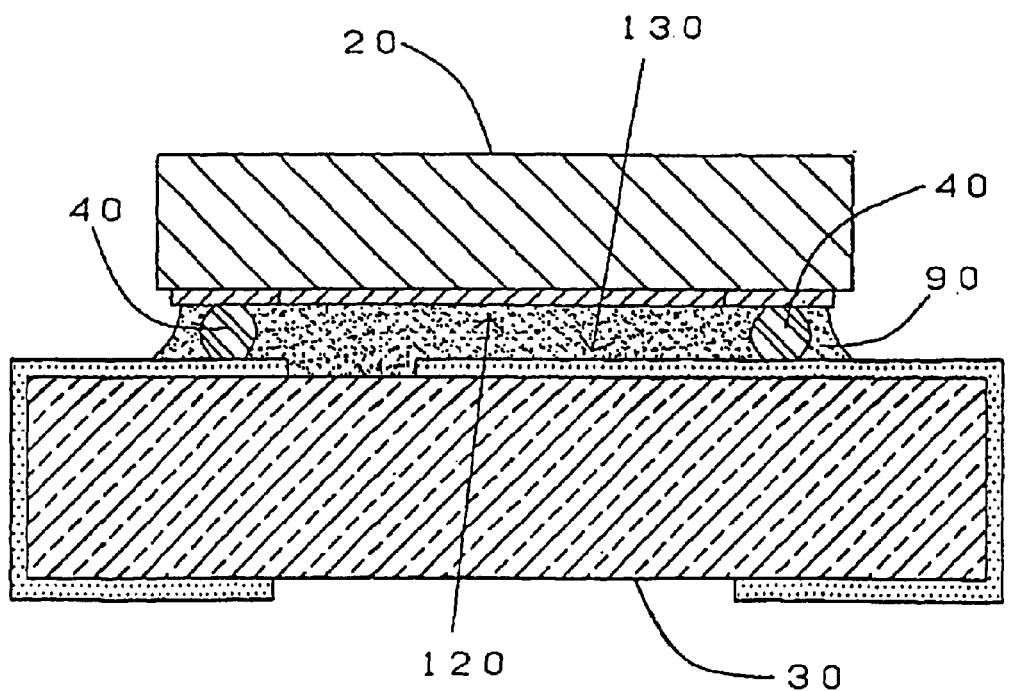
Figure 2:
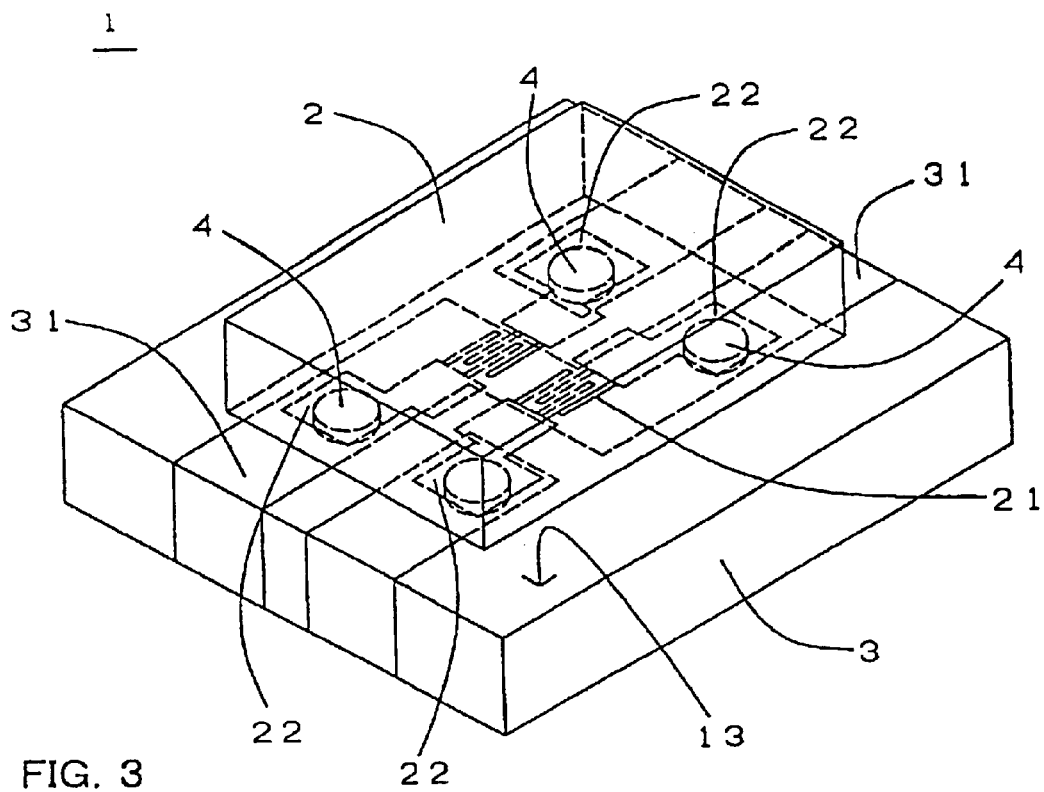
FIG. 2 is a perspective view of an electronic component according to a preferred embodiment of the present invention.

FIG. 2 is a perspective view of an electronic component 1 according to a preferred embodiment of the present invention. FIG. 3 is a longitudinal cross-sectional view of the electronic component 1 of this preferred embodiment. Moreover, FIG. 4 is a perspective view of an electronic element 2, which in this example is a surface acoustic wave element, having a functional surface 12 located at the upper surface thereof when oriented as shown in the figure.

In this preferred embodiment, the electronic component 1 is a surface mount component, and is to be mounted onto a mother board (not shown). As shown in FIGS. 2, 3, and 4, the electronic component 1 includes the electronic element 2 and a substrate 3. The electronic element 2 is, for example, a surface acoustic wave element having at least one IDT electrode disposed on, a predetermined functional surface of a piezoelectric substrate. The substrate 3 is preferably made of an insulating material such as a ceramics material, resins, or other suitable material, and has a predetermined mount surface on which the electronic element 2 is mounted. The substrate 3 having the electronic element 2 mounted thereto is covered with a lid, and the electronic element 2 is also covered with the lid, though not shown in FIGS. 2, 3 and 4.

Figures 4, 5:
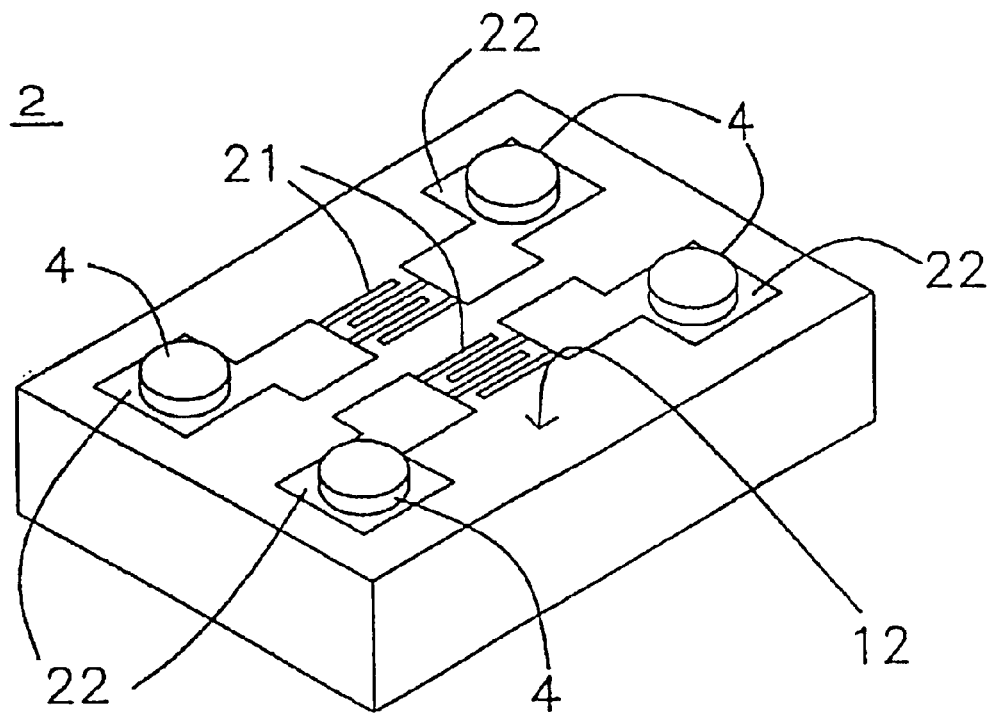
FIG. 4 is a perspective view of a surface acoustic wave element as an example electronic element, the functional surface of which is located at the upper surface in the figure.
FIG. 5 is a table showing the relationship between the value obtained by dividing the total bonding-area of metal bumps by the mass of the electronic element and the fault ratio measured by a falling test.

As shown in FIG. 4, in the electronic element 2, which is a surface acoustic wave element, an IDT (interdigital) electrode 21 for transmitting-receiving a surface acoustic wave and electrode pads 22 are disposed on a predetermined functional surface 12 thereof. The IDT electrode 21 and the electrode pads 22 are arranged so that predetermined electrical characteristics can be obtained. Metallic bumps 4, e.g., preferably made of Au or an alloy including Au as a major component are disposed on the electrode pads 22. In this preferred embodiment, one metallic bump 4 is disposed on each of the four metallic pads 22, as shown in FIG. 4. For formation of the metallic bumps, the convention wire-bumping method is preferably used.

If the total number of metallic bumps is one or two, a force such as a moment will be readily applied to the electronic component 1 when mechanical impact, which may be caused by falling or other condition, is added to the electronic component 1. Thus, the resistance of the electronic component 1 to impact will be deteriorated. For this reason, the total number of metallic bumps 4 is preferably at least three.

The electrode pads 22 preferably include electrically conductive electrodes each having Al as a major component which are disposed on an undercoat electrode with a contact metal (a thin-film including as a main component Ti, Ni, NiCr, or other suitable material) being interposed between the pads and the undercoat electrode, the undercoat electrode being formed simultaneously with the IDT electrode 21 by the known photolithography process, though not shown in FIG. 4.

Figure 3:
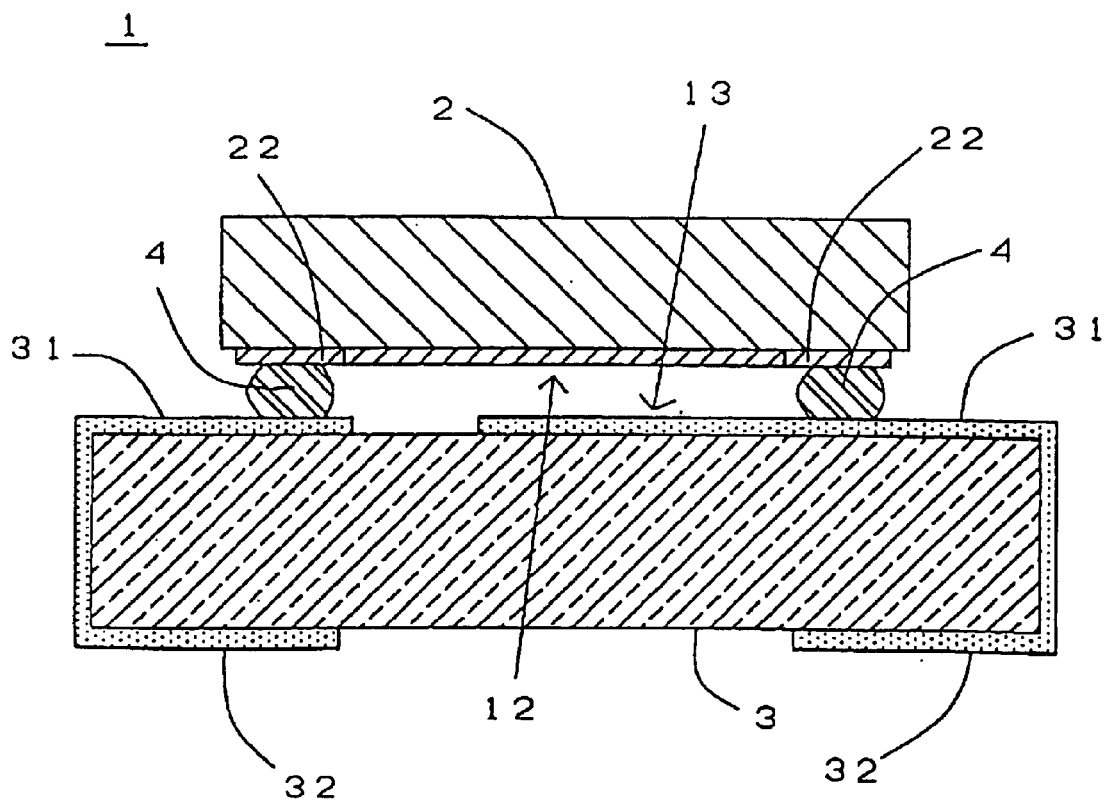
FIG. 3 is a longitudinal cross-sectional view of the electronic component of the preferred embodiment of FIG. 2.

As shown in FIGS. 2 and 3, internal electrode terminals 31 are provided on the predetermined mount surface 13 of the substrate 3, and are connected to the metallic bumps 4. Furthermore, external electrode terminals 32 with which the electronic component 1 can be surface-mounted onto a mother board (not shown) are disposed on the side of the substrate 3 opposite to the mount surface 13. The internal electrode terminals 31 and the external electrode terminals 32 are electrically connected to each other by conductors disposed on the side surfaces of the substrate 3. In this preferred embodiment, the internal electrode terminals 31, the external electrode terminals 32, and the conductors connecting these terminals preferably include W (wolfram) as a major component, and have Ni and Au plated thereon in this order, respectively.

The electronic element 2, which in this example is a surface acoustic wave element, is connected and fixed to the internal electrode terminals 31 disposed on the mount surface 13 of the substrate 3 electrically and mechanically via the metallic bumps 4, e.g., by the known flip-chip bonding method using both of supersonic waves and heat. The surface of the internal electrode terminals 31, which is plated with Au, can be sufficiently bonded to the metallic bumps made of Au or including Au, due to the Au-Au bond. It should be noted that no under-fill or the like is used, since the electronic element 2 is a surface acoustic wave element.

In the electronic component 1 described above, both of the value obtained by dividing the total area in which the metallic bumps 4 and the electronic element 2 are bonded to each other by the mass of the electronic element 2 and the value obtained by dividing the total area in which the metallic bumps 4 and the substrate 3 are bonded to each other by the mass of the electronic element 2 are preferably approximately 8.8 $mm^2/g$. This is carried out, since no under-fill is used, that is, in order to prevent the mechanical bond between the electronic element 2 and the substrate 3 from being deteriorated.

Hereinafter, a description will be provided with reference to FIG. 5, of the relationship between the fault ratio of the electronic component 1 measured by the falling test, the value obtained by dividing the total area in which the metallic bumps 4 and the electronic element 2 are bonded to each other by the mass of the electronic element 2, and the value obtained by dividing the total area in which the metallic bumps 4 and the substrate 3 are bonded to each other by the mass of the electronic element 2.

FIG. 5 is a table showing the relationship between the value obtained by dividing the total area in which the metallic bumps 4 and the electronic element 2 are connected to each other by the mass of the electronic element 2, and the fault ratio measured by the falling test.

For this falling test, 100 samples each having as the electronic element 2 a surface acoustic wave element of $LiTaO_3$ having a weight of about 3.52 mg were prepared and were mounted to the substrate and subjected to the load-falling test. The fault ratio was measured. In particular, the test was conducted assuming that the electronic component would be used in a portable telephone. A sample was fixed to the upper surface (that is, the surface opposite to that of the weight which comes into contact with the ground when it falls) of a 100 g weight, with one surface out of the six surfaces of the electronic element 2 to be measured being contacted with the upper surface of the weight. The sample was made to fall 16 times from a height of about 1.5 m. This was carried out for each of the six surfaces of the electronic element 2 having a substantially rectangular parallelepiped shape. In this falling test, the total bonding-area of the metallic bumps 4 bonded to the substrate 3 was larger than that of the metallic bumps 4 bonded to the electronic element 2.

In this preferred embodiment, the total bonding-area of the metallic bumps 4 bonded to the electronic element 2 and that of the metallic bumps 4 bonded to the substrate 3 are determined as follows.

Referring to the total bonding-area of the metallic bumps 4 bonded to the electronic element 2, in the flip-chip bonding method, the metallic bumps 4 including Au as a major component are mechanically brought into contact with the electrode pads 22 including Al as a major component disposed on the electronic element 2, and supersonic waves or heat is applied to cause the Au and the Al to diffuse into each other, so that an alloy layer of Au and Al is formed. The alloy layer contributes to the bonding. Thus, the bonding-area of the alloy layer is taken as the total bonding-area. To determine the total bonding-area, the electronic component 1 of the present invention is dipped into hydrochloric acid to dissolve the electrode pads 22 including Al as a major component. Thus, the metallic bumps 4 including Au as a major component are separated from the electronic element 2. Observation of the surface of the metallic bumps 4 shows that the Au is gold in color, while the alloy layer including Au and Al is gray. The area of the portion of the surface of each metallic bump 4 which contacted the electrode pad 22 before the separation, and on which the alloy layer of Al and Au is disposed, is measured. The total of the areas is taken as the total bonding-area of the metallic bumps 4 bonded to the electronic element 2. The area of the portion of the metallic bump 4 on which the alloy layer of Al and Au is disposed is measured by means of a microscope with which calculation can be carried out.

Referring to the total bonding-area of the metallic bumps 4 bonded to the substrate 3, the bonding-surface of the substrate is plated with Au, and the metallic bumps 4 include Au as a major component. Thus, the substrate 3 and the metallic bumps 4 are bonded to each other by means of the same type materials. Accordingly, the contact area of each bump 4 is measured, and the total area is taken as the total-bonding area of the metallic bumps 4 bonded to the substrate 3. The contact-area of each bump 4 is measured by a red-check method or other suitable method. According to the red-check method, an electronic component is dipped into red ink, so that the surface of the electronic component is colored red. Thereafter, a metallic bump is separated from the substrate, and the area of the portion of the substrate not colored red is measured.

As shown in FIG. 5, the fault ratio of the electronic component 1 obtained by the falling test was about 31% for a value of approximately 6.000 mm$^2$/g obtained by dividing the total bonding-area of the metallic bumps 4 bonded to the electronic element 2 by the mass of the electronic element 2.

Moreover, the fault ratio of the electronic component 1 obtained by the falling test was about 15% for a value of approximately 8.000 mm$^2$/g obtained by dividing the total bonding-area of the metallic bumps 4 bonded to the electronic element 2 by the mass of the electronic element 2.

On the other hand, the fault ratio of the electronic component 1 obtained by the falling test was low, that is, about 7% for a value of approximately 8.800 mm$^2$/g obtained by dividing the total bonding-area of the metallic bumps 4 bonded to the electronic element 2 by the mass of the electronic element 2.

For this value of about 8.800 mm$^2$/g, there are very few cases in which a portable telephone, as an example, fails when it falls less than 100 times, due to the carelessness of a user. Thus, when the fault ratio is reduced to about 7%, it may be concluded that the durability of the electronic component 1 has substantially no problems in its practical use.

Accordingly, it is preferable that the value obtained by dividing the total bonding-area of the metallic bumps 4 bonded to the electronic element 2 by the mass of the electronic element 2 is about 8.8 mm$^2$/g or higher. Thus, high quality electronic components are provided having fault ratios, which may be caused by falling, that are low. More preferably, the value obtained by dividing the total bonding-area of the metallic bumps 4 bonded to the electronic element 2 is preferably about 11.6 mm$^2$/g or higher. In this case, the falling test shows a fault ratio of 0%. In practice, the fault, which may be caused by falling, can be prevented substantially perfectly.

It should be noted that this falling test deals with the case in which the total contact-area of the metallic bumps 4 contacting the substrate 3 is larger than the total bonding-area of the metallic bumps 4 bonded to the electronic element 2. Similar results are obtained in the case in which the total bonding-area of the metallic bumps 4 bonded to the electronic element 2 is larger than the total contact-area of the metallic bumps 4 contacting the substrate 3.

Although the description above provides details of the preferred structure and properties of the electronic component according to preferred embodiments of the present invention, it is to be understood that the present invention is not limited by the particularities mentioned therein. More particularly, numerous modifications and variations can be made.

For example, in a preferred embodiment described above, the metallic bumps 4 are preferably formed by a wire-bumping method. This method is not restrictive. The metallic bumps 4 may be formed, e.g., by a plating method, or other suitable method.

Moreover, in this preferred embodiment, as an example of the structure of the electrode pads 22, the conductive material including Al as a major component and the contact metal are laminated. The lamination is not restrictive. The electrode pads 22 may be formed simultaneously with the IDT electrode 21 by photolithography or other suitable method. The number of layers can be desirably selected. Moreover, the configurations of the IDT electrode 21 and the electrode pads 22 are not limited to those shown in FIG. 4.

In this preferred embodiment, the internal electrode terminals 31, the external electrode terminals 32, and the conductors connecting these electrodes each preferably has a structure in which Ni and Au are plated onto W (wolfram). This is not restrictive. It is preferred that the uppermost layer is made of Au for its sufficient connection to the metallic bumps 4 made of Au or an alloy including Au as a major component.

Also, in this preferred embodiment, the flip-chip bonding method preferably includes the use of both supersonic waves and heat. Flip-chip bonding using either heat or supersonic waves can be applied without any trouble.

Furthermore, in this preferred embodiment of the present invention, as the electronic component 1, a surface mount component mounted on a mother board is used as an example. This is not restrictive. The present invention may be applied to an electronic component (not shown) including an electronic element mounted directly onto a mother board.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An electronic component comprising:
   an electronic element;
   a substrate to which the electronic element is mounted; and
   at least three bumps arranged such that the electronic element and the substrate being one of electrically and mechanically connected to each other by the at least three bumps; wherein
   both a value obtained by dividing a total bonding-area of the at least three bumps bonded to the electronic element by a mass of the electronic element and a value obtained by dividing the total bonding-area of the at least three bumps bonded to the substrate by the mass of the electronic element are at least about 8.8 mm$^2$/g.

2. An electronic component according to claim 1, wherein both the value obtained by dividing the total bonding-area of the at least three bumps bonded to the electronic element by the mass of the electronic element and the value obtained by dividing the total bonding-area of the at least three bumps bonded to the substrate by the mass of the electronic element are at least about 11.6 mm$^2$/g.

3. An electronic component according to claim 1, wherein the electronic element and the substrate are mechanically connected to each other by the at least three bumps only.

4. An electronic component according to claim 1, wherein the at least three bumps are made of one of Au and an alloy including Au as a major component.

5. An electronic component according to claim 1, wherein the electronic element is a surface acoustic wave element including at least one IDT electrode disposed on a piezoelectric substrate.

6. An electronic component according to claim 1, wherein the electronic element is a surface acoustic wave element.

7. An electronic component according to claim 1, wherein the substrate is made of an insulating material.

8. An electronic component according to claim 1, wherein the at least three bumps are made of a metallic material.

9. An electronic component according to claim 1, wherein metallic pads are provided on the substrate and each of the at least three bumps is provided on a respective one of the metallic pads.

10. An electronic component according to claim 1, wherein the electronic element has internal electrode terminals plated with Au and the internal electrode terminals are arranged to contact the at least three bumps.

11. An electronic component according to claim 1, wherein the substrate includes a mounting surface upon which the electronic element is mounted and the mounting surface of the substrate is plated with Au.

12. An electronic component according to claim 11, wherein the at least three bumps include Au.

13. An electronic component according to claim 1, wherein the electronic element includes internal electrode terminals, external electrode terminals, and conductors connecting the internal and external electrodes.

14. An electronic component according to claim 13, wherein each of the internal electrode terminals, the external electrode terminals, and the conductors has a structure in which Ni and Au are plated onto W.

* * * * *